(12) United States Patent
He et al.

(10) Patent No.: US 10,951,108 B1
(45) Date of Patent: Mar. 16, 2021

(54) SWITCHING POWER SUPPLY CONTROLLING CIRCUIT AND CONTROLLING METHOD THEREOF

(71) Applicant: JOULWATT TECHNOLOGY (HANGZHOU) CO., LTD., Zhejiang (CN)

(72) Inventors: Yongji He, Zhejiang (CN); Xunjin Dou, Zhejiang (CN); Xunwei Zhou, Zhejiang (CN)

(73) Assignee: JOULWATT TECHNOLOGY (HANGZHOU) CO., LTD., Zhejiang (CN)

( * ) Notice: Subject to any disclaimer, the term of this patent is extended or adjusted under 35 U.S.C. 154(b) by 0 days.

(21) Appl. No.: 16/690,530

(22) Filed: Nov. 21, 2019

(30) Foreign Application Priority Data

Aug. 22, 2019  (CN) .......................... 201910777850.5

(51) Int. Cl.
*H02M 1/00* (2006.01)
*H02M 1/08* (2006.01)
*H02M 1/14* (2006.01)

(52) U.S. Cl.
CPC ............. *H02M 1/08* (2013.01); *H02M 1/143* (2013.01); *H02M 2001/0019* (2013.01)

(58) Field of Classification Search
CPC ................... H02M 1/08; H02M 1/143; H02M 2001/0019; H02M 1/088; H02M 3/158
See application file for complete search history.

(56) References Cited

U.S. PATENT DOCUMENTS

2012/0001608 A1* 1/2012 Sato .................... H02M 3/1588
323/282

* cited by examiner

*Primary Examiner* — Adolf D Berhane
*Assistant Examiner* — Afework S Demisse
(74) *Attorney, Agent, or Firm* — Muncy, Geissler, Olds & Lowe, P.C.

(57) ABSTRACT

This invention provides a switching power supply controlling circuit, the switching power supply comprises an upper transistor and a lower transistor, the switching power supply controlling circuit comprises a boost circuit, an input terminal of the boost circuit is connected to an input terminal of the switching power supply, the boost circuit output a first voltage to control a working state of the boost circuit, driving the upper transistor to be in an on state. The switching power supply controlling circuit adopts a boost circuit to provide a driving power for the upper transistor, and there is no need to set a bootstrap pin or a bootstrap capacitor.

14 Claims, 3 Drawing Sheets

SWITCHING POWER SUPPLY CONTROLLING CIRCUIT AND CONTROLLING METHOD THEREOF

CROSS-REFERENCE TO RELATED APPLICATIONS

This Non-provisional application claims priority under 35 U.S.C. § 119(a) on Chinese Patent Application No(s). 201910777850.5 filed on Aug. 22, 2019, the entire contents of which are hereby incorporated by reference.

BACKGROUND OF THE INVENTION

Field of the Invention

This invention relates to a technical field of power electronics, and more particularly, to a switching power supply controlling circuit and a controlling method thereof.

Description of the Related Art

In the prior art, FIG. 1 shows a schematic diagram of a control circuit of a buck converter, and FIG. 2 shows a schematic diagram of a control circuit of a step-up circuit. In order to drive the upper transistor Q1 of the boost converter or the buck converter, a bootstrap capacitor Cbs needs to be set. A first terminal of the bootstrap capacitor Cbs is connected to a common terminal SW of the upper transistor Q1 and the lower transistor Q2, and a second terminal of the bootstrap capacitor Cbs is connected to an input terminal of the boost converter or the buck converter through a diode. In the prior art, the bootstrap capacitor Cbs and the bootstrap pin BST must be set, and the bootstrap capacitor Cbs is large, which is not easy to be integrated in a chip, increasing the circuit area and design cost.

BRIEF SUMMARY OF THE INVENTION

The object of the invention is to provide a control circuit and a control method of a small area switching power supply, which are used to solve the problem of setting a bootstrap capacitor in the prior art.

In order to achieve above-mentioned objectives, this invention provides a switching power supply controlling circuit, the switching power supply includes an upper transistor and a lower transistor, the switching power supply controlling circuit includes a boost circuit, an input terminal of the boost circuit is connected to an input terminal of the switching power supply, the boost circuit output a first voltage to control a working state of the boost circuit, driving the upper transistor to be in an on state.

Optionally, the switching power supply controlling circuit further may include an auxiliary circuit, the auxiliary circuit may receive the first voltage, and an output terminal of the auxiliary circuit may be connected to a control terminal of the upper transistor to control the upper transistor to be in an off state.

Optionally, the boost circuit may receive a first control signal, the auxiliary circuit may receive a second control signal, the first control signal may be provided to control the boost circuit to work, and the second control signal may be provided to control the auxiliary circuit to off the upper transistor.

Optionally, the boost circuit may include a first inductor, a switch transistor, a rectification transistor and a first capacitor; a first terminal of the first inductor may be connected to an input terminal of the switching power supply, a second terminal of the first inductor may be connected to a first terminal of the switch transistor, a second terminal of the switch transistor may be connected to ground, a control terminal of the switch transistor may receive the first control signal; a first terminal of the rectification transistor may be connected to a common terminal of the first inductor and the switch transistor, a second terminal of the rectification transistor may be connected to a first terminal of the first capacitor, a second terminal of the first capacitor may be connected to a second terminal of the upper transistor, a first terminal of the upper transistor may be an input terminal or an output terminal of the switching power supply, and a voltage of the first capacitor may be the first voltage.

Optionally, the boost circuit further may include a clamping circuit, and the clamping circuit and the first capacitor may be connected in parallel.

Optionally, the auxiliary circuit may include a second switch transistor, a first terminal of the second switch transistor may be connected to a control terminal of the upper transistor, a second terminal of the second switch transistor may be connected to a first terminal of the first capacitor, and a control terminal of the second switch transistor may be connected to an input terminal the switching power supply.

Optionally, the auxiliary circuit further may include a third switch transistor, a first terminal of the third switch transistor may be connected to a control terminal of the upper transistor, a second terminal of the third switch transistor may be connected to ground, and a control terminal of the third switch transistor may receive the second control signal.

Optionally, the switching power supply may be a boost converter or a buck converter.

Optionally, the switching power supply controlling circuit may be integrated into a chip, and a lead inductor of the chip may be provided as the first inductor.

This invention also provides a switching power supply controlling method, the switching power supply includes an upper transistor and a lower transistor, the controlling method includes: connecting an input terminal of the switching power supply with an input terminal of a boost circuit, outputting an first voltage from the boost circuit to control a working state of the boost circuit, driving the upper transistor to be in an on state; and receiving the first voltage by an auxiliary circuit, connecting a control terminal of the upper transistor with an output terminal of the auxiliary circuit to control the upper transistor to be in an off state.

Compared with the prior art, the invention has the following advantages: connecting an input terminal of the switching power supply with an input terminal of a boost circuit, outputting an first voltage from the boost circuit to control a working state of the boost circuit, driving the upper transistor to be in an on state; and receiving the first voltage by an auxiliary circuit, connecting a control terminal of the upper transistor with an output terminal of the auxiliary circuit to control the upper transistor to be in an off state. The switching power supply controlling circuit adopts a boost circuit to provide a driving power for the upper transistor, and there is no need to set a bootstrap pin or a bootstrap capacitor.

DETAILED DESCRIPTION OF THE INVENTION

The preferable embodiments of this invention are described in detail below in combination with the accompanying drawings. However, this invention is not limited to these embodiments. This invention covers any alternatives, modifications, equivalent methods, and equivalent solutions within the spirit and scope of this invention.

In order to make the public have a thorough understanding on this invention, specific details are described in the following preferable embodiments of this invention, while those skilled in the art will fully understand this invention without descriptions of these details.

This invention is described more specifically in a way of taking examples with reference to the accompanying drawings in the following paragraphs. It should be noted that all the accompanying drawings are in a simplified form and not in accurate proportions, which are merely for conveniently and clearly illustrating embodiments of this invention.

Figure 1:
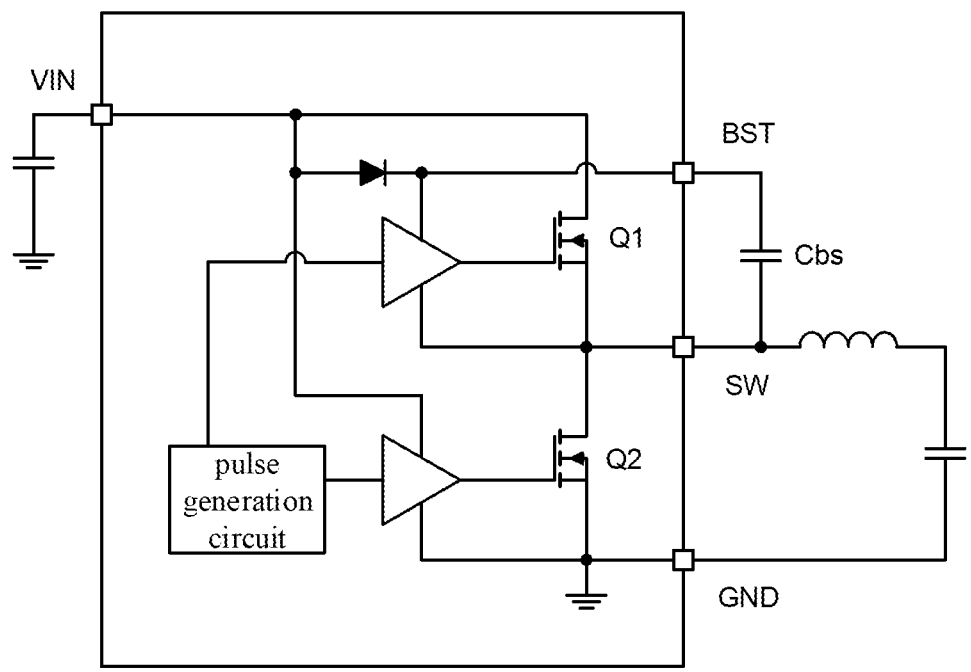
FIG. 1 is a schematic diagram of a control circuit of a buck converter in the prior art.
Figure 2:
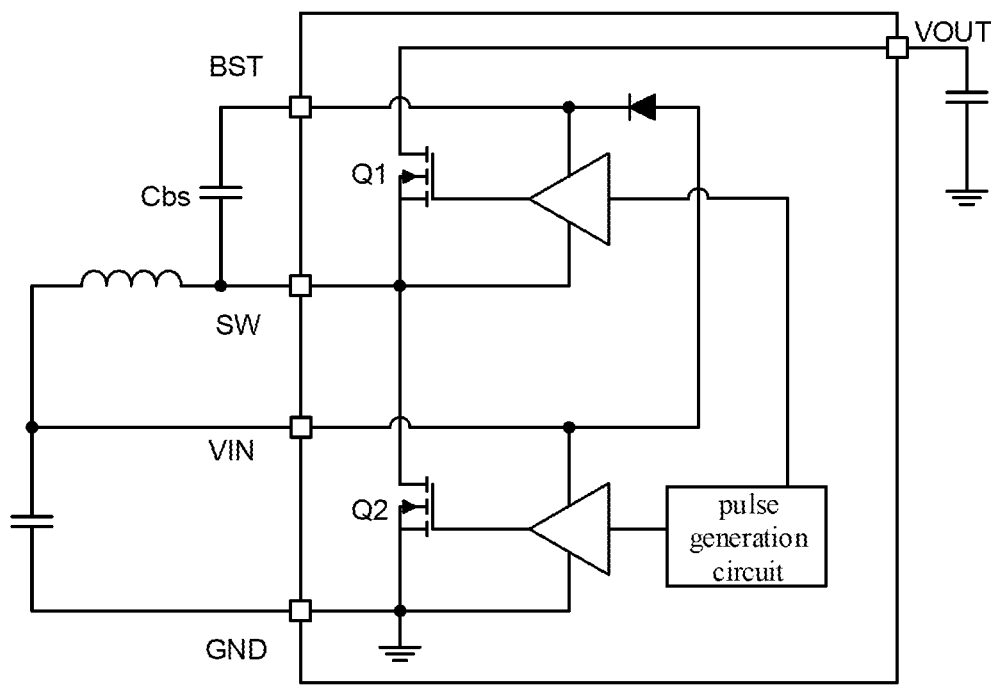
FIG. 2 is a schematic diagram of a control circuit of a boost converter in the prior art.
Figure 3:
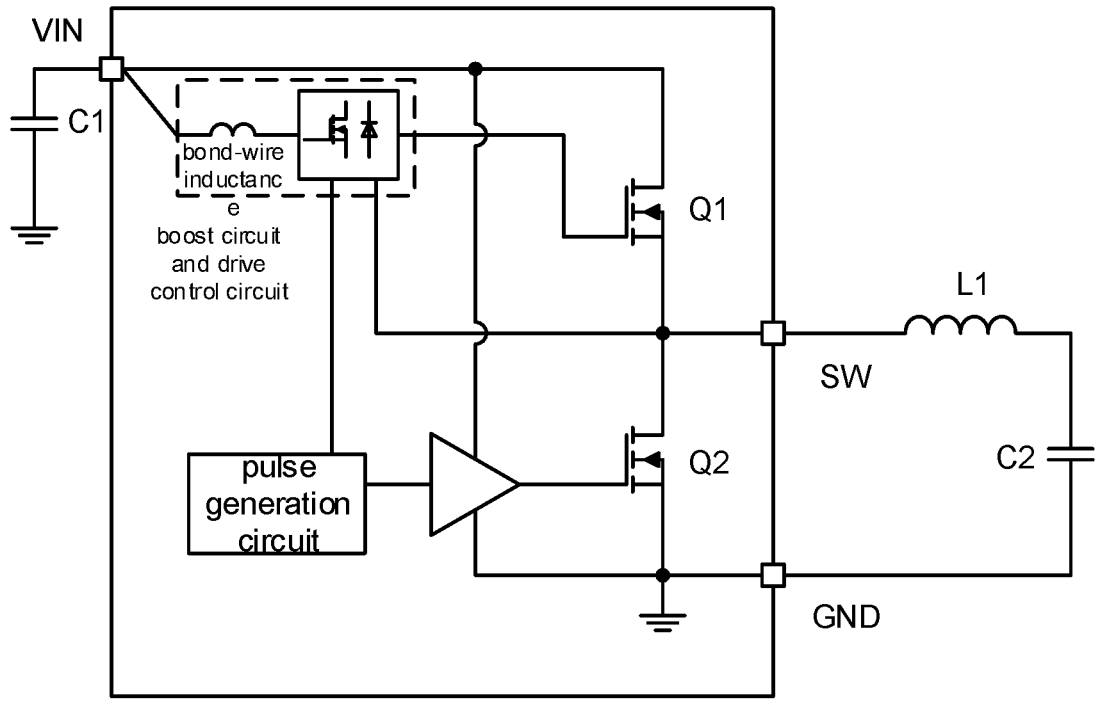
FIG. 3 is a control block diagram of a buck converter of to this invention.

FIG. 3 shows a control block diagram of a buck converter of to this invention. The buck converter includes an upper transistor Q1, a lower transistor Q2, a inductor L1, and a capacitor C2. The upper transistor Q1 is a main switch transistor, and the lower transistor Q2 is a rectification transistor. A first terminal of the upper transistor Q1 receive an input voltage VIN, a second terminal of the upper transistor is connected to a first terminal of the lower transistor Q2, and a second terminal of the lower transistor Q2 is connected to ground. A common terminal SW of the upper transistor Q1 and the lower transistor Q2 is connected to a first terminal of the inductor L1, a second terminal of the inductor L1 is connected to a first terminal of the capacitor C1, and a second terminal of the capacitor C2 is connected to ground. A control circuit of the buck converter includes a boost circuit to drive the upper transistor Q1 using a parasitic inductance of a line and a bond-wire inductance of a pin generated in a integration of the control circuit as an energy storage inductance of the boost circuit, that is, the bond-wire inductance in the figure. The control circuit of the buck converter further includes a pulse generation circuit, and the pulse generation circuit output a plurality of pulse signals, to drive the boost circuit of the control circuit and to control a working state of the lower transistor Q2 respectively.

Figure 4:
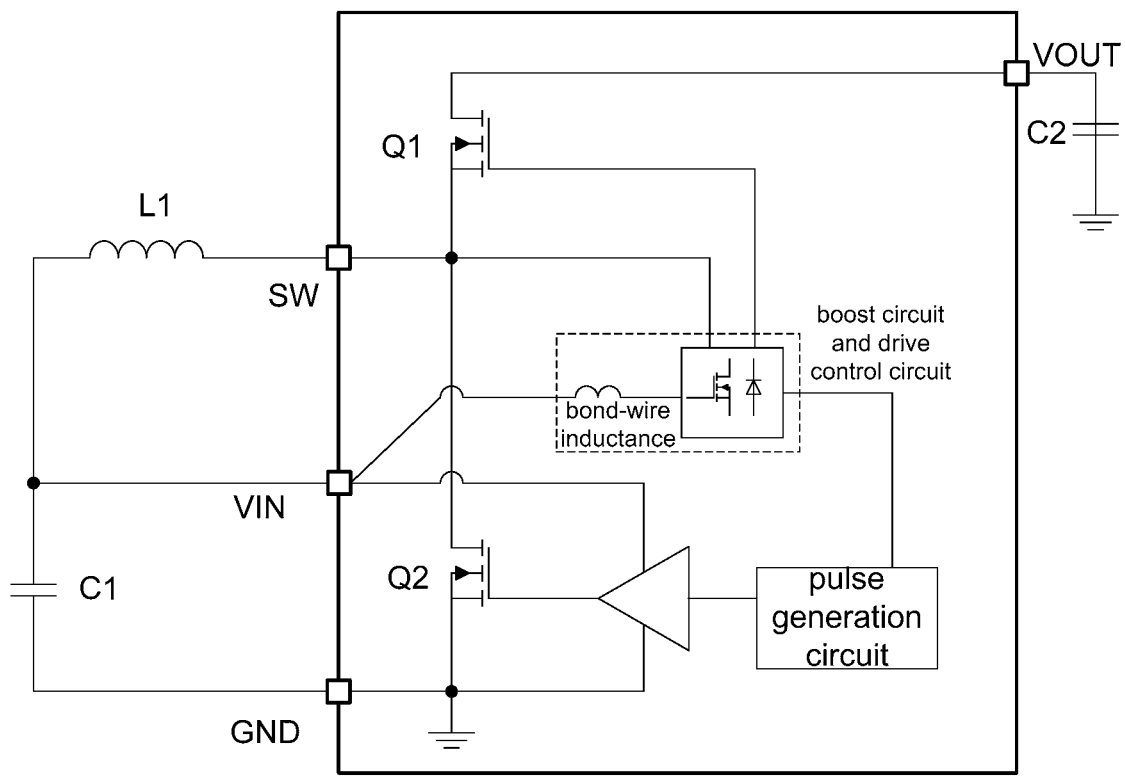
FIG. 4 is a control block diagram of a boost converter of to this invention.

FIG. 4 shows a control block diagram of a boost converter of to this invention. The boost converter includes an upper transistor Q1, a lower transistor Q2, a inductor L1, and a capacitor C2. The upper transistor Q1 is a synchronous rectification switch transistor, and the lower transistor Q2 a main switch transistor. A first terminal of the upper transistor Q1 is connected to a first terminal of the capacitor C2 as an output terminal, a second terminal of the capacitor C2 is connected to ground, a second terminal of the upper transistor Q1 is connected to a first terminal of the lower transistor Q2, and a second terminal of the lower transistor Q2 is connected to ground. A common terminal SW of the upper transistor Q1 and the lower transistor Q2 is connected to a first terminal of the inductor L1, and a second terminal of the inductor L1 is connected to and receive an input voltage VIN. The controlling circuit of the boost converter further includes a boost circuit to drive the upper transistor Q1 using a parasitic inductance of a line and a bond-wire inductance of a pin generated in a integration of the control circuit as an energy storage inductance of the boost circuit, that is, the bond-wire inductance in the figure. The control circuit of the buck converter further includes a pulse generation circuit, and the pulse generation circuit output a plurality of pulse signals, to drive the boost circuit of the control circuit and to control a working state of the lower transistor Q2 respectively.

Figure 5:
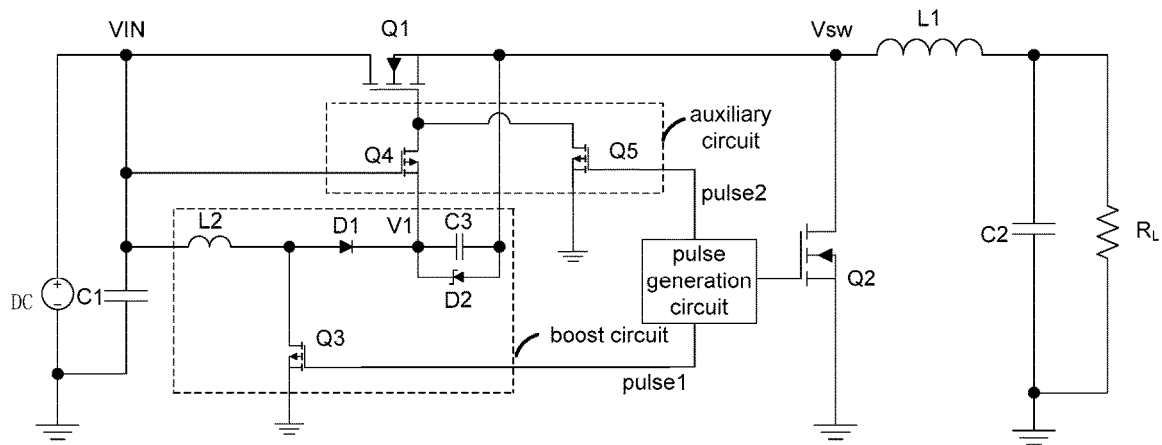
FIG. 5 is a schematic diagram of a control circuit of the buck converter to this invention.

FIG. 5 shows a schematic diagram of a control circuit of the buck converter to this invention. The control circuit includes a boost circuit, an auxiliary circuit, and a pulse generation circuit. The boost circuit includes a first switch transistor Q3, a first inductor L2, a first capacitor C3, a diode D1, and a first stabilivolt D2. The auxiliary circuit includes a second switch transistor Q4 and a third switch transistor Q5. The diode D1 is used as a rectification transistor of the boost circuit, and the first stabilivolt D2 is used as a clamping circuit to clamp an output voltage of the boost circuit. A first terminal of the first inductor L2 is connected to an input terminal of the buck converter, a second terminal of the first inductor L2 is connected to a first terminal of the first switch transistor Q3, and a second terminal of the first switch transistor Q3 is connected to ground. A control terminal of the first switch transistor Q3 receive the first control signal pulse1. An anode of the diode D1 is connected to a common terminal of the first inductor L2 and the first switch transistor Q3, a cathode of the diode D1 is connected to a first terminal of the first capacitor C3, and a second terminal of the first capacitor C3 is connected to a second terminal of the upper transistor Q1. A first terminal the upper transistor Q1 is an input terminal of the buck converter; the first stabilivolt D2 and the first capacitor C3 are connected in parallel, and a first terminal of the second switch transistor Q4 is connected to a control terminal of the upper transistor Q1. A second terminal of the second switch transistor Q4 is connected to a common terminal of the diode D1 and the first capacitor C3, and a control terminal of the second switch transistor Q4 is connected to the input terminal of the buck converter in this embodiment of this invention. A first terminal of the third switch transistor Q5 is connected to the control terminal of the upper transistor Q1, a second terminal of the third switch transistor Q5 is connected to ground, a control terminal of the third switch transistor Q5 receive a second control signal pulse2. The pulse generation circuit generate the first control signal pulse1, the second control signal pulse2, and a control signal to drive a switch state of the lower transistor. A working process of the control circuit of the buck converter is as follows:

L1 inductor in energy storage phase: the first control signal is applied from the control terminal of the first switch transistor Q3. When the first switch transistor Q3 is in an on state, the inductor L2 stores energy, and an on-state resistance of the first switch transistor Q3 plays a role of limiting current. When the first switch transistor Q3 is in an off state, a current from the first inductor L2 charges the capacitance C3 through the diode D1, which raise a negative voltage of the first stabilivolt D2. When a voltage of the capacitor is higher than a first threshold value Vsw+VTH (VTH is a gate threshold voltage of Q4), the second switch transistor Q4 is in an on state, and a capacitance voltage of the first capacitor C3 is applied to a gate-source of the upper transistor Q1, and the upper transistor Q1 is in an on state.

L1 inductor in energy releasing phase: the second control signal is applied from the control terminal of the third switch transistor Q5. When the third switch transistor Q5 is in an on state, discharge a gate of the upper transistor Q1 to make the upper transistor Q1 in an off state, and then the pulse generation circuit output a pulse signal to drive Q2 to be in an on state to enable freewheeling.

Figure 6:
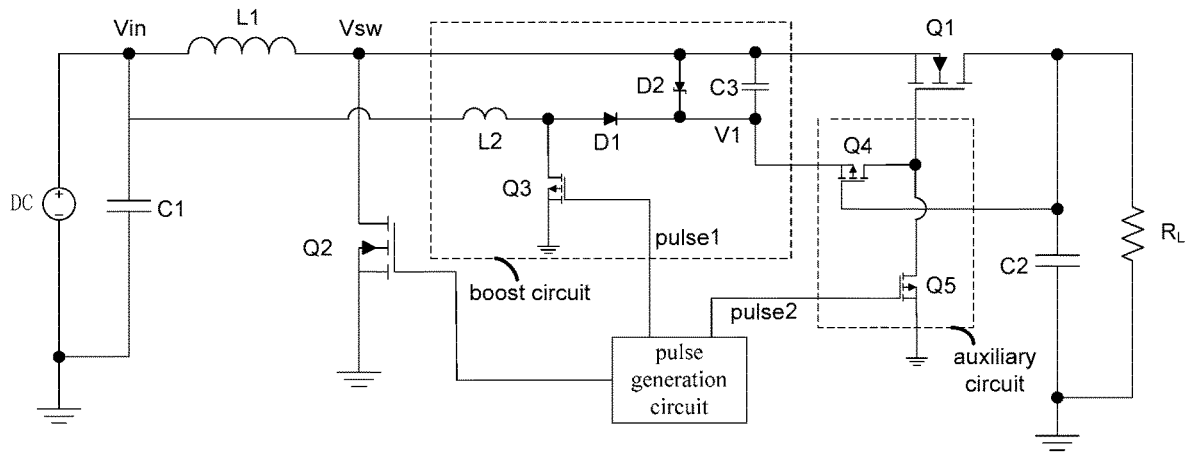
FIG. 6 is a schematic diagram of a control circuit of the boost converter to this invention.

FIG. 6 shows a schematic diagram of a control circuit of the boost converter to this invention. The difference between the boost converter in FIG. 6 and the step-down control circuit in FIG. 5 is as follows: the control terminal of the second switch transistor Q4 is connected to an output terminal of a boost circuit in this invention. A working process is as follows:

L1 inductor in energy storage phase: the second control signal is applied from the control terminal of the third switch transistor Q5, the third switch transistor Q5s in an on state and discharges a gate of the lower transistor Q2 to make the lower transistor Q2 in an off state, and then the pulse generation circuit output a pulse signal to drive the upper transistor Q1 to be in an on state, and the inductor L1 storage energy.

L1 inductor in energy releasing phase: the upper transistor Q1 is in an off state, and a current of the inductor L1 freewheels through the diode of the lower transistor Q2. The first control signal is applied from the control terminal of the first switch transistor Q3. When the first switch transistor Q3 is in an on state, the first inductor L2 storage energy, and an on-state resistance (RDSON) of the first switch transistor Q3 plays a role of limiting current. When the first switch transistor Q3 is in an off state, a current from the first inductor L2 charges the first capacitor C3 through the diode D1, which raise a negative voltage of the first stabilivolt D2. When a voltage of the first capacitor is higher than a first threshold value Vsw+VTH (VTH is a gate threshold voltage of Q4), the second switch transistor Q4 is in an on state, and a capacitance voltage of the first capacitor C3 is applied to a gate-source of the lower transistor Q2, and the lower transistor Q2 is in an on state to perform synchronous rectification.

Figure 7:
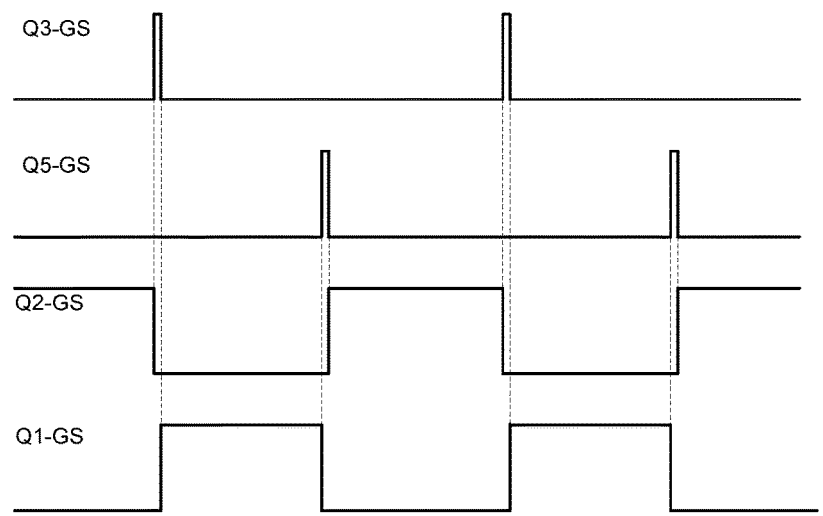
FIG. 7 is an operation waveform diagram to this invention.

FIG. 7 shows an operation waveform diagram to this invention. The Q1-GS waveform in the figure characterizes an on/off state of the upper transistor Q1, the Q2-GS waveform characterizes an on/off state of the lower transistor Q2, and the Q3-GS waveform characterizes an on/off state of the first switch transistor Q3. The Q5-GS waveform characterizes an on/off state of the third switch transistor Q5. When the first switch transistor Q3 is turned on briefly, the lower transistor Q2 is controlled to be in an off state, and the upper transistor Q1 to be in an on state. When the third switch transistor Q5 is in an on state briefly, the upper transistor Q1 is controlled to be in an on state and the lower transistor Q2 to be in an off state.

Although embodiments are separately described and illustrated in the foregoing, while with respect to partial common technology, from the view of those skilled in the art, it is possible to replace and integrate embodiments. Another recorded embodiment can be used for reference referring to the content that is not explicitly described in one embodiment.

The above-mentioned implement ways are not intended to limit the protection scope of this technical solution. Any modifications, equivalent substitutions, and improvements within the spirit and principle of the above-mentioned implement ways should be included in the protection scope of this technical solution.

What is claimed is:

1. A switching power supply controlling circuit, wherein a switching power supply comprises an upper transistor and a lower transistor, the switching power supply controlling circuit comprises a boost circuit, an input terminal of the boost circuit is connected to an input terminal of the switching power supply, the boost circuit output a first voltage to drive the upper transistor to be in an on state;

wherein the switching power supply controlling circuit further comprises an auxiliary circuit the auxiliary circuit receives the first voltage, and an output terminal of the auxiliary circuit is connected to a control terminal of the upper transistor to control the upper transistor to be in an off stat.

2. The switching power supply controlling circuit according to claim 1, wherein the boost circuit receives a first control signal, the auxiliary circuit receives a second control signal, the first control signal is provided to control the boost circuit to work, and the second control signal is provided to control the auxiliary circuit to off the upper transistor.

3. The switching power supply controlling circuit according to claim 2, wherein the boost circuit comprises a first inductor, a switch transistor, a rectification transistor and a first capacitor; wherein a first terminal of the first inductor is connected to an input terminal of the switching power supply, a second terminal of the first inductor is connected to a first terminal of the switch transistor, a second terminal of the switch transistor is connected to ground, a control terminal of the switch transistor receives the first control signal; a first terminal of the rectification transistor is connected to a common terminal of the first inductor and the switch transistor, a second terminal of the rectification transistor is connected to a first terminal of the first capacitor, a second terminal of the first capacitor is connected to a second terminal of the upper transistor, a first terminal of the upper transistor is an input terminal or an output terminal of the switching power supply, and a voltage of the first capacitor is the first voltage.

4. The switching power supply controlling circuit according to claim 3, wherein the boost circuit further comprises a clamping circuit, and the clamping circuit and the first capacitor are connected in parallel.

5. The switching power supply controlling circuit according to claim 4, wherein the switching power supply is a boost converter or a buck converter.

6. The switching power supply controlling circuit according to claim 3, wherein the switching power supply is a boost converter or a buck converter.

7. The switching power supply controlling circuit according to claim 3, wherein the switching power supply controlling circuit are integrated into a chip, and a lead inductor of the chip is provided as the first inductor.

8. The switching power supply controlling circuit according to claim 2, wherein the auxiliary circuit comprises a second switch transistor, a first terminal of the second switch transistor is connected to a control terminal of the upper transistor, a second terminal of the second switch transistor is connected to a first terminal of the first capacitor, and a control terminal of the second switch transistor is connected to an input terminal the switching power supply.

9. The switching power supply controlling circuit according to claim 8, wherein the auxiliary circuit further comprises a third switch transistor, a first terminal of the third switch transistor is connected to a control terminal of the upper transistor, a second terminal of the third switch transistor is connected to ground, and a control terminal of the third switch transistor receives the second control signal.

10. The switching power supply controlling circuit according to claim 9, wherein the switching power supply is a boost converter or a buck converter.

11. The switching power supply controlling circuit according to claim 8, wherein the switching power supply is a boost converter or a buck converter.

12. The switching power supply controlling circuit according to claim 2, wherein the switching power supply is a boost converter or a buck converter.

13. The switching power supply controlling circuit according to claim 1, wherein the switching power supply is a boost converter or a buck converter.

14. A switching power supply controlling method, wherein the switching power supply comprises an upper transistor and a lower transistor, wherein the controlling method comprises:
   connecting an input terminal of the switching power supply with an input terminal of a boost circuit, outputting an first voltage from the boost circuit to control a working state of the boost circuit, driving the upper transistor to be in an on state; and
   receiving the first voltage by an auxiliary circuit, connecting a control terminal of the upper transistor with an output terminal of the auxiliary circuit to control the upper transistor to be in an off state.

* * * * *